United States Patent [19]

Rai et al.

[11] Patent Number: 4,818,728
[45] Date of Patent: Apr. 4, 1989

[54] METHOD OF MAKING A HYBRID SEMICONDUCTOR DEVICE

[75] Inventors: Akiteru Rai, Osaka; Keiji Yamamura; Takashi Nukii, both of Nara, all of Japan

[73] Assignee: Sharp Kabushiki Kaisha, Osaka, Japan

[21] Appl. No.: 128,437

[22] Filed: Dec. 3, 1987

[30] Foreign Application Priority Data

Dec. 3, 1986 [JP] Japan ................. 61-288264

[51] Int. Cl.⁴ .................. H01L 21/60; H01L 21/58
[52] U.S. Cl. ............................ 437/209; 29/739; 437/974; 228/179; 228/209; 357/80
[58] Field of Search ............ 437/974, 209, 220, 215, 437/211; 29/729, 739; 174/52 R, 52 H; 357/80

[56] References Cited

U.S. PATENT DOCUMENTS 3,436,818  12/1965  Merrin et al. .............. 174/52 FP
4,701,424  10/1987  Mikkor ...................... 437/209

FOREIGN PATENT DOCUMENTS 0042370  4/1977  Japan ........................ 437/211
0202540  11/1983  Japan ........................ 437/209
0154633  8/1985  Japan ........................ 437/191
0212030  9/1986  Japan ........................ 437/209
1361400  7/1974  United Kingdom .......... 437/209

Primary Examiner—Brian E. Hearn
Assistant Examiner—Beverly A. Pawlikowski
Attorney, Agent, or Firm—Birch, Stewart, Kolasch & Birch

[57] ABSTRACT

A method for making a semiconductor device of a type comprising at least first and second semiconductor circuit units, which method comprises the step of forming a plurality of connecting electrodes on an upper surface of each of at least first and second semiconductor substrates; forming an electrically insulating layer entirely over the upper surface of each of the first and second substrates so as to cover the respective connecting electrodes; partially removing the insulating layer on each of the first and second substrates to permit the respective electrodes to be exposed to the outside; forming metal studs on the first substrate in contact with the electrodes so as to protrude outwardly of the respective insulating layer to complete the first semiconductor unit and forming solder deposits on the second substrate in contact with the respective electrodes on such second substrate to complete the second semiconductor unit; combining the first and second semiconductor units with the metal studs in the first semiconductor unit aligned respectively with the solder deposits in the second semiconductor unit; and heating the resultant assembly to allow the solder deposits to be melted with the associated metal studs consequently immersed into the melted solder deposits thereby to accomplish a firm interlock between the electrodes on the first and second substrates.

5 Claims, 2 Drawing Sheets

METHOD OF MAKING A HYBRID SEMICONDUCTOR DEVICE

BACKGROUND OF THE INVENTION

1. (Field of the Invention)

The present invention generally relates to the manufacture of semiconductor devices and, more particularly, to the method of making a hybrid semiconductor device composed of a stack of semiconductor integrated circuit boards.

2. (Description of the Prior Art)

The degree of integration of semiconductor circuit components per chip, that is, the density to which semiconductor components can be fabricated in a single chip, has rapidly increased because of improvement in micro-processing technology and design technique. As a result of these advancements and in an attempt to provide a high-density, high-performance semiconductor IC device, a three-dimensional integrated circuit is currently devised without altering existing design requirements. The three-dimensional IC device currently manufactured is available in two types. One is the monolithic type which comprises, as shown in FIG. 5 of the accompanying drawings, a single silicon substrate 10 on which insulating layers 11 and semiconductor layers 12 are alternately stacked one above the other by the use of a chemical vapor deposition technique or the like. The other is the hybrid type which, as shown in FIG. 6 of the accompanying drawings, comprises a plurality of two-dimensional chips 14 mounted one above the other, each neighboring two-dimensional chip 14 being electrically connected by a flip chip bonding technique or the like through a plurality of connecting electrodes 15 that extend in a direction along the thickness of each chip 14.

Comparing the manufacturing technology and the design, the hybrid semiconductor IC device 16 shown in FIG. 6 has fewer problems than the monolithic semiconductor IC device 13 and possesses a wider range of applications.

However, the hybrid semiconductor IC device known in the art has a detrimental problem in that, since the connecting electrodes 15 are not insulated the pitch between each neighboring connecting electrodes 15 can not be smaller than 200 μm. This problem hampers a high-density electrode connection.

In order to obviate the problem discussed in connection with the hybrid semiconductor IC device shown in FIG. 6, a manufacturing process such as shown in FIG. 7 has been proposed. As shown in FIG. 7, the method begins with step (a) at which a plurality of connecting electrodes 21 are formed on an upper surface of an IC substrate 20 and a protective layer 22 is subsequently formed entirely over the upper surface of the substrate 20 so as to cover the connecting electrodes 21. At subsequent step (b), portions of the protective layer 22 are perforated in a depth sufficient to permit the respective electrodes 21 to be exposed to the outside through the resultant perforations 23, followed by the insertion of conductor pieces 24 through the perforations 23, each of the conductor pieces 24 being of a sufficient size to permit a portion thereof to be exposed outwardly from the protective layer 22. After the insertion of the conductor pieces 24, and as shown by step (c), a resinous bonding agent having an electrically insulating property is applied over the protective layer 22 to form a bonding layer 25 overlaying the conductor pieces 24, followed by step (d) at which the bonding layer 25 is etched off until respective upper regions of the conductor pieces 24 are exposed to complete a single semiconductor IC unit 26. Then, at step (e), another semiconductor IC unit 26' having an IC substrate 20', electrodes 21', a protective layer 22', conductor pieces 24' and a bonding layer 25' all formed in the manner as hereinbefore described in connection with the semiconductor unit 26 with reference to steps (a) to (d) is placed over the substrate 26 with the conductor pieces 24 in the semiconductor unit 26 exactly aligned with the conductor pieces 24' in the semiconductor unit 26' and the assembly is subsequently hot-pressed to allow the bonding layers 25 and 25' to be bonded together. After hot-pressing, the conductor pieces 24 in the semiconductor unit 26 and the conductor pieces 24' in the additional semiconductor unit 26' are electrically connected together.

According to the illustrated method of making the hybrid semiconductor IC device, to achieve satisfactory and reliable electric connections between the conductor pieces 24 in one semiconductor unit 26 and the conductor pieces 24' in the other semiconductor unit 26', it is essential that the upper region of each of the conductor pieces 24 and 24' must be flat and level with respect to the etched outer surface of the corresponding bonding layer 25, that any one of the substrates 20 and 20' must be warp free and flat, and that the semiconductor units 26 and 26' must be uniformly pressed together over the entire surface during the hot press step.

Failure to fulfill these requirements result in unsatisfactory electric connection between either some or all of the conductor pieces 24 and 24' which in turn reduces production yield and reliability. However, it is very difficult using conventional techniques and equipment to accomplish these requirements. Moreover, since the temperature and the pressure used during the hot press are fairly high, it often occurs that some or all of semiconductor elements formed on each of the substrates 20 and 20' of the respective semiconductor units 26 and 26' tend to be damaged or, at least, adversely affected.

SUMMARY OF THE INVENTION

Accordingly, the present invention is intended to substantially eliminate the above discussed problems inherent in the prior art method of making hybrid semiconductor IC devices by an improved method effective to provide a high-density, high performance semiconductor IC device wherein circuit elements are closely connected and integrated in a reliable manner.

The present invention provides an improved method for making a semiconductor device of a type having at least first and second semiconductor circuit boards or units positioned one above the other, the steps of said method comprising the formation of a plurality of connecting electrodes on an upper surface of each of the first and second semiconductor substrates and, also, of an electrically insulating layer entirely over the upper surface of each of the first and second substrates covering the respective connecting electrodes. Subsequently, portions of the insulating layer on each of the substrates are partially removed to permit the respective electrodes to be exposed. Thereafter, metal studs are formed on the first substrate in contact with the electrodes to protrude out of the respective insulating layer completing the first semiconductor unit Solder deposits are then formed on the second substrate in contact with the respective electrodes on such second substrate to complete the second semiconductor unit. The first and second semiconductor units are placed one above the other with the metal studs in the first semiconductor unit aligned respectively with the solder deposits in the second semiconductor unit. The resultant assembly is then heated to allow the solder deposits to be melted with the associated metal studs consequently immersed into the melted solder deposits. Thus, when the assembly is cooled with the solder deposits solidified, rigid and reliable electric connection can be accomplished between the metal studs and the solder deposits.

With the method of the present invention, a satisfactory and reliable electric connection can be achieved between the electrodes in the first and second semiconductor units with no substantial reduction in production yield or reliability. Moreover, since the high temperature and high pressure used during the hot press step are not employed, there is substantially no possibility that the semiconductor elements formed on each of the substrates of the respective semiconductor units will be damaged.

Furthermore, the method according to the present invention can enhance the high density integration of IC circuit components which would ultimately bring about reduction in circuit operating speed.

BRIEF DESCRIPTION OF THE DRAWINGS

This and other objects and features of the present invention will become clear from the following description taken in conjunction with preferred embodiments thereof, given for the purpose of illustration only, with reference to the accompanying drawings, in which:

FIG. 1(III) is a sectional view of the semiconductor IC device formed of the semiconductor units of FIGS. 1(I) and 1(II);

DETAILED DESCRIPTION OF THE EMBODIMENTS

Figure 1A:
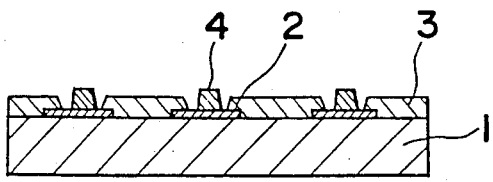
FIG. 1(I) is a sectional view of one of semiconductor units used in a semiconductor IC device according to a preferred embodiment of the present invention.
FIG. 1(II) is a sectional view of the other of the semiconductor units to be used in combination with the semiconductor unit of FIG. 1(I) to complete the semiconductor IC device.

Referring first to FIGS. 1(I), I(II) and I(III), the present inventor provides a method for making a semiconductor device i.e. a hybrid semiconductor IC device, of a type having at least first and second semiconductor circuit boards or units positioned one above the other electronically connected by electrodes 2 and 2'.

Figure 1B:
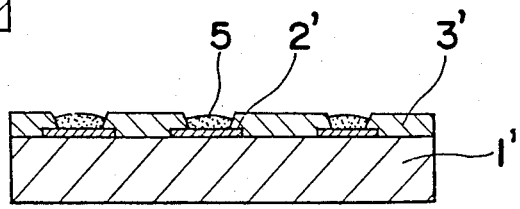
Figure 1C:
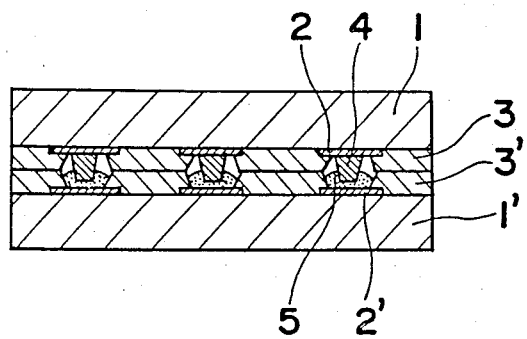

As shown in FIGS. 1(I) and 1(II), each of the first and second semiconductor circuit units includes a semiconductor substrate 1 and 1' having operating elements formed thereon. The respective semiconductor substrate 1 and 1' also has a a plurality of electrodes 2 and 2' respectively deposited on an upper major surface of the substrate 1 and 1', each neighboring member of the elctrodes 2 and 2' being spaced a predetermined distance from each other. The electrodes 2 and 2' may be made of any known material, having appropriate conductive capacities for example, aluminum.

An electrically insulating layer 3 and 3' made of, for example, $SiO_2$ or $SiN$ is formed over the associated substrate 1 and 1' on each of the semiconductor circuit units to cover the electrodes 2 and 2'. Subsequently, portions of the insulating layer 3 and 3' on each of the first and second substrates 1 and 1' are partially removed to permit the respective electrodes 2 and 2' to be exposed while leaving corresponding holes in the insulating layer 3 and 3' in register with the associated electrodes 2 and 2'.

Thereafter, as best shown in FIG. 1(I), metal studs 4 made of, for example, Cu or Au are formed on the first substrate 1 in contact with the electrodes 2 protruding outwardly of the insulating layer 3 to complete the first semiconductor unit. With reference to FIG. 1(II), solder deposits 5 made of, for example, Sn, Pb or In are deposited in the respective holes of the insulating layer 3' on the second substrate 1'. The solder deposits 5 contact the respective electrodes 2' on the second substrate 1' to complete the second semiconductor unit.

The first and second semiconductor units are, as best shown in FIG. 1(III), then placed one above the other with the metal studs 4 in the first semiconductor unit 1 aligned respectively with the solder deposits 5 in the second semiconductor unit 1'. The resultant assembly is then heated. During heating, the solder deposits 5 are melted to accommodate the associated metal studs 4 then immersed into the melted solder deposits 5. The amount of each solder deposit 5 placed in the respective hole of the insulating layer 3' is so selected so that, when it is melted during heating of the assembly, the melted solder deposit 5 will not spread on the outer surface of the insulating layer 3' due to thermal expansion.

Thus, when the assembly is cooled and the solder deposits solidified, the metal studs 4 are firmly interlocked with the solder deposits 5 thereby creating a rigid and reliable electric connection between the electrode 2 on the first substrate 1 and the electrodes 2' on the second substrate 2' completing the hybrid semiconductor IC device.

The temperature used to melt the solder deposits 5 in the practice of the method of the present invention is comparably lower than that used for the prior art method of hot pressing as previously described with reference to FIG. 7. Moreover, there is no need for high pressure bonding as in the practice of the prior art method to assemble the first and second semiconductor units. Therefore, eliminating the higher heat and pressure increase the possibility that damage to the operating elements formed on each of the substrates 1 and 1' be minimized or substantially eliminated further this substantially eliminate the need for the prior requirements associated with electrode-to-electrode connection.

Figure 2:
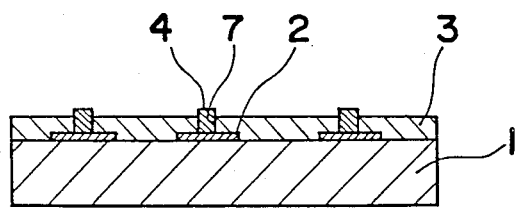
FIGS. 2 to 4 are views similar to FIGS. 1(I) to 1(III), respectively, showing different embodiments of the present invention.

In the foregoing embodiment, the insulating layer 3 and 3' has been described as partially removed to form the holes in alignment with the associated electrodes 2 or 2'. However, in the embodiment of in FIG. 2, the insulating layer 3 is perforated at locations in alignment with the associated electrodes 2 to form holes for accommodating the metal studs 4 of generally cylindrical shape for bonding with the solder deposit 5 of the second semiconductor unit (not shown). Each of the perforated holes for accommodating the cylindrical metal studs 4 has a diameter large enough for receiving the associated cylindrical metal stud 4 to be readily inserted into such perforated hole.

Figure 3:
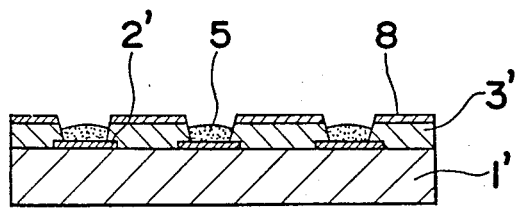
Figure 4:
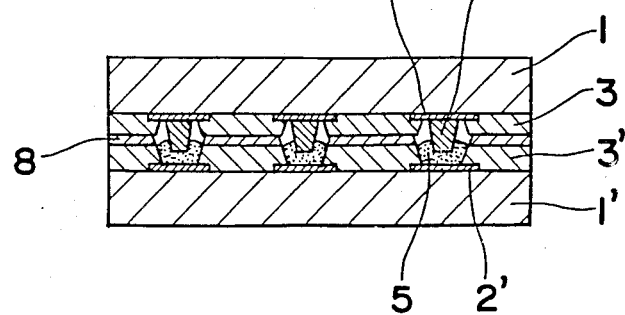
Figure 5:
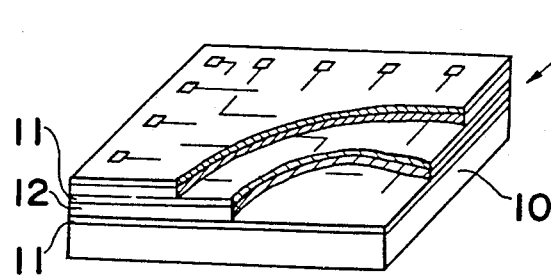
FIGS. 5 and 6 are schematic perspective views of the prior art monolithic and hybrid semiconductor IC devices.
Figure 6:
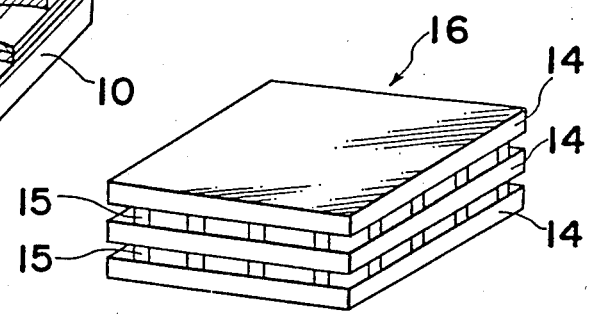
Figure 7A:
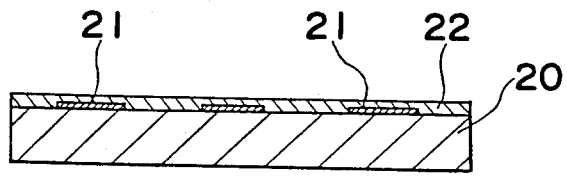
FIG. 7 are sectional views of a hybrid semiconductor device illustrating steps for making hybrid semiconductor IC device.
Figure 7B:
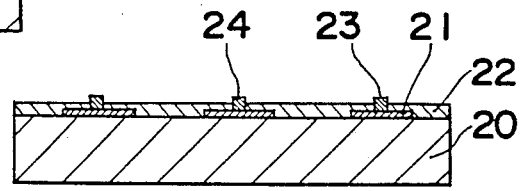
Figure 7C:
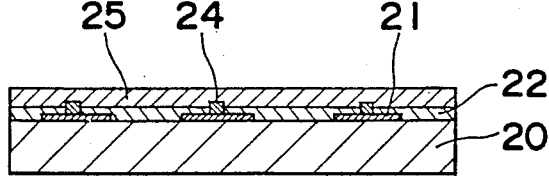
Figure 7D:
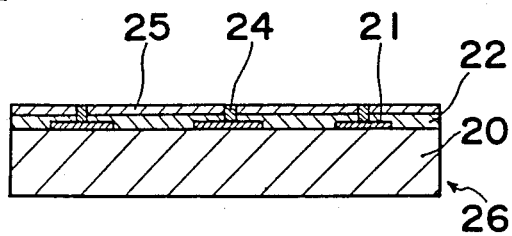
Figure 7E:
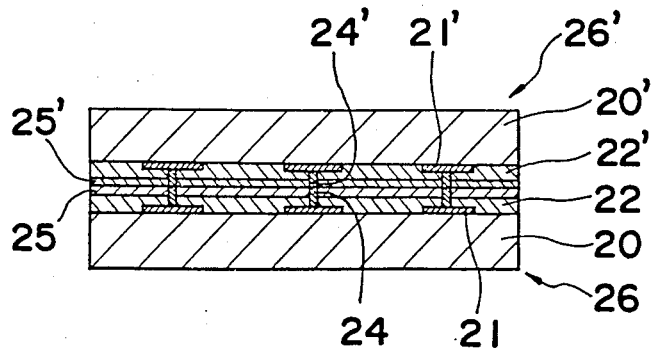

An alternative embodiment of the second semiconductor unit which can be used in the practice of the method of the present invention is shown in FIG. 3. According to the embodiment shown in FIG. 3, an electrically insulating bonding agent is applied to the outer surface of the insulating layer 3' to form a bonding layer 8 thereby to complete the modified second semiconductor unit. After formation of the bonding layer 8 overlaying the insulating layer 3' collectively forming a the modified second substrate unit, the first semiconductor unit shown in and described with reference to FIG. 1(I) is placed over the modified second substrate unit as shown in FIG. 4 to bond the insulating layers 3 and 3' together. The resultant assembly of the first and second semiconductor units is, then, heated in a manner as hereinbefore described to interlock the metal studs 4 with the solder deposits 5.

According to the embodiment shown in and described with reference to FIGS. 3 and 4, since the metal studs 4 firmly interlock with the solder deposits 5 to connect the electrodes 2 and 2' together and also the insulating layers 3 and 3' are bonded or connected together, the first semiconductor unit is held in tight contact with the modified second semiconductor unit substantially over the entire surface thereof. The first and modified second semiconductor units are firmly bonded together with the electrodes 2 firmly connected with the electrodes 2', thereby creating a semiconductor IC device having an improved reliability. A similar bonding layer may be also formed on the insulating layer 3 in the first semiconductor unit.

Further if desired, a metal layer may be interposed between each of the metal studs 4 and the associated electrode 2, and/or between each of the electrodes 2' and the associated solder deposit 5.

Also, although reference has been made to use of a two semiconductor units to form the single semiconductor IC device, three or more semiconductor units may be employed. Specifically, where the three semiconductor units are used, one of the semiconductor substrates in the respective semiconductor units which would be positioned intermediate between the other semiconductor substrates may have its opposite major surfaces provided with the metal studs or the solder deposits.

Thus, although the present invention has been fully described in connection with preferred embodiment thereof with reference to the accompanying draiwngs, it is to be noted that various changes and modifications are apparent to those skilled in the art.

What is claimed is:

1. A method for making a semiconductor device of a type comprising at least first and second semiconductor circuit units, which method comprises the step of;

forming a plurality of connecting electrodes on an upper surface of each of at least first and second semiconductor substrates;

forming an lectrically insulating layer entirely over the upper surface of each of the first and second substrates so as to cover the respective connecting electrodes;

partially removing the insulating layer on each of the first and second substrates to permit the respective electrodes to be exposed to the outside;

forming metal studs on the first substrate in contact with the electrodes so as to protrude outwardly of the respective insulating layer to complete the first semiconductor unit and forming solder deposits on the second substrate in contact with the respective electrodes on such second substrate to complete the second semiconductor unit;

juxtaposing the first and second semiconductor with the metal studs in the first semiconductor unit aligned respectively with the solder deposits in the second semiconductor unit; and heating the resultant assembly to allow the solder deposits to be melted with the associated metal studs consequently immersed into the melted solder deposits thereby to accomplish a firm interlock between the electrodes on the first and second substrates.

2. A method for making a semiconductor device having at least first and second semiconductor circuit units, the steps comprising:

forming a plurality of connecting electrodes on an upper surface of each of said first and second semiconductor circuit units;

providing electrically insulating layers over the upper surface of both said first and second semiconductor units separating said plurality of connecting electrodes;

partially removing said insulating layer exposing said plurality of connecting electrodes;

forming a plurality corresponding studs on said plurality of connecting electrodes of said first semiconductor unit whereby said studs protrude beyond the upper surface of said insulating layer;

depositing solder material in contact with the plurality of connecting electrodes of said second semiconductor unit;

juxtaposing said first semiconductor unit against said second semiconductor circuit units by emerging said studs of said first semiconductor unit into corresponding deposits of said solder material; and heating said combined first and second semiconductor circuit units to form the semiconductor device.

3. A method for making a semiconductor device as contained in claim 2, wherein the plurality of studs are cylindrically shaped.

4. A method for making a semiconductor device as contained in claim 2, further comprising:

inserting a bonding agent between the insulating layers of said first and second semiconductor circuit units.

5. A method of making a semiconductor device as contained in claim 2, further comprising:

forming perforated holes in said second semiconductor unit when partially removing said insulating layer.

* * * * *